US006627962B2

United States Patent
Tasaka

(10) Patent No.: US 6,627,962 B2
(45) Date of Patent: Sep. 30, 2003

(54) SEMICONDUCTOR MEMORY

(75) Inventor: Kazuhiro Tasaka, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 21 days.

(21) Appl. No.: 09/847,260

(22) Filed: May 2, 2001

(65) Prior Publication Data

US 2001/0049169 A1 Dec. 6, 2001

(30) Foreign Application Priority Data

Jun. 5, 2000 (JP) ........................................ 2000-167349

(51) Int. Cl.[7] .............................................. H01L 31/119
(52) U.S. Cl. ....................... 257/390; 257/393; 257/402; 257/406; 257/410; 257/411; 257/392
(58) Field of Search ................................. 257/393, 392, 257/402, 406, 410, 390, 411; 438/275, 278, 279

(56) References Cited

U.S. PATENT DOCUMENTS

| 5,270,944 | A | * | 12/1993 | Kuroda et al. ................. 716/3 |
| 5,910,925 | A | * | 6/1999 | Guterman et al. ....... 365/230.01 |
| 6,251,736 | B1 | * | 6/2001 | Brambilla et al. ........... 438/303 |
| 6,300,195 | B1 | * | 10/2001 | Pozzoni et al. .............. 438/257 |
| 6,312,990 | B1 | * | 11/2001 | Kim et al. ................... 438/257 |
| 6,326,266 | B1 | * | 12/2001 | Brambilla et al. ........... 438/258 |

FOREIGN PATENT DOCUMENTS

| JP | 02001168303 A | * | 8/1998 | ......... H01L/27/115 |
| JP | 11-40782 | | 2/1999 | |

* cited by examiner

Primary Examiner—Caridad Everhart
Assistant Examiner—Victor V Yevsikov
(74) Attorney, Agent, or Firm—Choate, Hall & Stewart

(57) ABSTRACT

A semiconductor memory and its manufacturing method enable high-integrated memory cell to be realized easily. The semiconductor memory according to the present invention has an impurity diffusion region with a second conductive type that is opposite to a first conductive type on a surface of a semiconductor substrate with the first conductive type. Further, the semiconductor memory has structure in which there are provided a floating gate electrode formed on the semiconductor substrate via a gate insulator, and a control gate electrode formed on the floating gate electrode via an interelectrode insulating film. Furthermore, there are provided the gate insulator on the surface of the semiconductor substrate with the exception of an impurity diffusion region, and a third insulating film with film thickness thicker than that of the gate insulator on the surface of the impurity diffusion region. Moreover, the floating gate electrode is extended to be provided on the surface of a side wall of the third insulating film.

4 Claims, 6 Drawing Sheets

SEMICONDUCTOR MEMORY

BACKGROUND OF THE INVENTION

1. Field of the Invention

The present invention relates to a semiconductor memory and its manufacturing method; and more particularly to a semiconductor memory and its manufacturing method in which it is possible to manufacture high-integrated semiconductor memory in spite of its size of memory cells.

2. Description of Related Art

Conventionally, as for the semiconductor memory, there is the mask-ROM (Mask Programmed Read Only Memory). With reference to the mask-ROM, writing of data is carried out during the manufacturing process thereof. However, the mask-ROM is subjected to diffusion process of ion in which ion implantation is carried out in order to inject impurity into silicon substrate by the use of ion such as boron and so forth. In the diffusion process of the ion, the writing of data is carried out depending on this ion injection. Diffusion of the ion occurs in the lateral direction caused by this ion injection. Thus, there is malfunction that interference occurs between neighboring memory cells caused by the diffusion of the ion in the lateral direction. Specifically, the diffusion of the ion in the lateral direction causes threshold voltage to increase of the ON-bit memory cell neighboring the OFF-bit memory cell, thus, there is malfunction that ON-bit memory cell is rewritten into the OFF-bit memory cell caused by increase of the threshold voltage of the ON-bit memory cell. For that reason, the memory cell has a limit in connection with its miniaturization. For instance, it is difficult to form the microscopic memory cell not more than 0.20 μm. Further, since the writing of data to the mask-ROM is carried out at the diffusion process, there is malfunction that many various intermediate off-the-shelf products according to content of the writing of data should be held by the time the manufacturing process ends.

Accordingly, OTP (One Time Programmable Read Only Memory) is employed as the measure for overcoming aforementioned malfunction. This OTP is PROM (Programmable Read Only Memory) to which writing data of only one time is capable of being carried out. The writing of data is carried out electrically. Therefore, interference between neighboring memory cells such as aforementioned mask-ROM can be inhibited. Since, it is only necessary to ensure reliability of writing of data of one time, it is possible to manufacture of the OTP cheaper than general semiconductor memory such as PROM, flash memory and so forth. Further, the OTP is capable of being written of the data after completion of the manufacturing process of the semiconductor memory not the process of diffusion of the ion (for instance in the test process), accordingly, inventory control becomes easy in comparison with the aforementioned mask-ROM.

Here, as for the OTP, which is explained on the basis of FIG. 4, FIG. 5 and FIG. 6.

FIG. 4 shows top plan typical view of memory cell portion of Virtual Ground Cell type large capacity NOR type OTP (semiconductor memory) 120 having impurity diffusion region 106 as a digit line. Further, FIG. 6 is a view illustrating a manufacturing process of this OTP 120 as well as a sectional view illustrating an arrow A—A of FIG. 4.

The OTP 120, as illustrated in FIG. 5, has a p-type silicon substrate 101 as single crystal silicon substrate, an impurity diffusion region 106 formed on the surface of this p-type silicon substrate 101, and a gate insulator 107 made of silicon oxide film that is formed on the surface of this p-type silicon substrate 101. Further, the OTP 120 has a floating gate electrode 109 made of polycrystalline silicon film formed on the gate insulator 107 extending between neighboring impurity diffusion regions 106, interelectrode insulating film 110 formed at unevenness portion (unevenness portion consisting of the gate insulator 107 and the floating gate electrode 109) of the p-type silicon substrate 101, control gate electrode 111 made of polycrystalline silicon film for embedding this unevenness portion, and tungsten silicide (Wsi) film 112 which is deposited on the control gate electrode 111.

Continuously, about manufacturing method of the OTP 120 is explained.

In the OTP 120, as illustrated in FIG. 6($a$), firstly, buffer layer 102 made of oxide film is formed on the surface of the p-type silicon substrate 101 by thermal oxidation of the p-type silicon substrate 101, then, silicon nitride film 103 is deposited on the buffer layer 102 as insulating film. Then, the silicon nitride film 103 of a section that becomes impurity diffusion region 106 in the future is removed by photolithography and dry etching. After that, n-type injection layer 104 is formed in such a way that arsenic ion ($As^+$) as n-type impurity is injected with the silicon nitride film 103 as mask material.

Continuously, as illustrated in FIG. 6($b$), the buffer layer 102 and the silicon nitride film 103 are removed. The gate insulator 107 is formed on the surface of the p-type silicon substrate 101 in such a way as to carry out thermal oxidation of this p-type silicon substrate 101. Further, impurity diffusion region 106 is formed in such a way as to diffuse impurity of the n-type injection layer 104 during heat treatment carried out after such thermal oxidation. Furthermore, polycrystalline silicon film 108 is deposited on the gate insulator 107. Then, as illustrated in FIG. 6($c$), floating gate electrode 109 made of the polycrystalline silicon film 108 is formed in such a way that the polycrystalline silicon film 108 on the impurity diffusion region 106 is subjected to patterning.

For instance, the floating gate electrode 109 is formed by the photolithography. On this occasion, the patterning is made to carry out while being employed approximately rectangular mask pattern for processing the floating gate electrode 109.

Subsequently, as illustrated in FIG. 6($d$), an interelectrode insulating film 110 is formed on unevenness portion (unevenness portion consisting of the gate insulator 107 and the floating gate electrode 109) of the p-type silicon substrate 101. After that, the unevenness portion is embedded by the polycrystalline silicon film. Thus, the control gate electrode 111 made of the polycrystalline silicon film is formed. Further, tungsten silicide (WSi) film 112 which is deposited due to chemical vapor deposition method (CVD method) on the control gate electrode 111 is formed.

After that, as illustrated in FIG. 4, the OTP 120 is formed in such a way that patterning is made to carry out while leaving the floating gate electrode 109 that becomes word line 114, the interelectrode insulating film 110, the control gate electrode 111 and the tungsten silicide (WSi) film 112.

The OTP 120 indicated in the aforementioned conventional example has capacitance "Csub" between the p-type silicon substrate (except impurity diffusion region 106) and the floating gate electrode 109 as well as capacitance "Cg" between the floating gate electrode 109 and the control gate electrode 111. Further, if one side of the impurity diffusion region 106 is taken to be drain region, while the other side is taken to be source region, the OTP 120 has capacitance "Cd" between the drain region and the floating gate electrode 109, as well as capacitance "Cs" between the source region and the floating gate electrode 109.

Ratio of the capacitance "Cg" between the floating gate electrode 109 and the control gate electrode 111 relative to the total capacitance of all is called as capacitive coupling ratio "Cr", and this capacitive coupling ratio "Cr" is indicated by formula (1):

$$Cr=Cg/(Cg+Csub+Cd+Cs) \quad (1)$$

One capacitance is mutual capacitance in the portion that the floating gate electrode 109 is extended over the impurity diffusion region 106 (capacitance "Cd" between the drain region and the floating gate electrode 109 as well as capacitance "Cs" between the source region and the floating gate electrode 109). The other capacitance is capacitance of opposite portion of the control gate electrode 111 to the side wall surface of the floating gate electrode 109. This capacitive coupling ratio "Cr" takes aforementioned both capacitance to be main components. Further, the capacitive coupling ratio "Cr" is made to increase by increasing these respective components, according to this strategy, voltage of writing data is capable of being suppressed in low voltage.

Extended portion of the floating gate electrode 109 described-above is a margin 121 illustrated in FIG. 6(*c*) that is required for mask matching when forming the floating gate electrode 109. Specifically, when the photolithography is carried out using approximately rectangular mask pattern, corner of the pattern of the photo-resist is rounded caused by occurrence of interference of light at the time of exposure at end of the rectangular portion. For that reason, if work (dry etching) of the floating gate electrode 109 is made to carry out while taking the pattern of this photo-resist to be the material of the mask, the floating gate electrode 109 itself becomes a rounded shape on its corner. When the rounded corner of this floating gate electrode 109 causes change of area of channel region of the memory cell, this malfunction is directly connected with change of characteristic of the memory cell itself.

For that reason, it is necessary that the margin 122 is made to ensure for separating the floating gate electrode 109 surely between neighboring memory cells, and that the rounded portion is not positioned on the channel region in such a way as to project the floating gate electrode 109 sufficiently on the impurity diffusion region 106. Further, it is necessary to consider a deviation of position for the exposure in the photolithography. On the basis of the aforementioned reason, the margin 121 that is designed enough widely is required.

On the other hand, it is necessary to minimize the margin 121 with reducing the size of the memory cell. However, with minimizing the margin 121, offset occurs between the impurity diffusion region 106 and the floating gate electrode 109. Namely, the extended portion disappears as the size of the memory cell is reduced. As a result, there is fear that the memory cell does not operate caused by no extended portion. Further, since the capacitive coupling ratio "Cr" decreases as the size of the memory cell is reduced, voltage of the writing of data increases, thus operation margin of the memory cell decreases. Namely, as for the OTP 120 indicated in the above-described conventional example, it is difficult to realize that high integrated memory cell is made to obtain while reducing size of the memory cell, and that high integrated memory cell is made to obtain without changing the size of the memory cell.

SUMMARY OF THE INVENTION

The present invention has been made in consideration of the above mentioned problems. It is one object of the present invention is to provide a semiconductor memory and its manufacturing method in which it is possible to solve inconvenience included in the conventional example, particularly, it is possible to increase capacitive coupling ratio in spite of size of the memory cell, for that reason, it is possible to cause voltage of data-writing for applying to the memory cell to be lowered.

It is another object of the present invention to provide a semiconductor memory and its manufacturing method in which the memory cell can be made to operate effectively without changing size of the memory cell, or the memory cell can be made to operate effectively while reducing size of the memory cell.

The semiconductor memory according to the present invention has an impurity diffusion region with a second conductive type that is opposite to a first conductive type on a surface of a semiconductor substrate with the first conductive type. Further, the semiconductor memory has structure in which there are provided a floating gate electrode formed on the semiconductor substrate via a gate insulator, and a control gate electrode formed on the floating gate electrode via an interelectrode insulating film. Furthermore, there are provided the gate insulator on the surface of the semiconductor substrate with the exception of an impurity diffusion region, and a third insulating film with film thickness thicker than that of the gate insulator on the surface of the impurity diffusion region. Moreover, the floating gate electrode is extended to be provided on the surface of a side wall of the third insulating film.

By constituting the semiconductor memory in such a way described-above, specifically, the floating gate electrode can be made to form at the surface of the side wall (extended portion of the surface of the side wall of the impurity diffusion region) of the third insulating film, therefore, it is possible to form the semiconductor memory without taking into consideration offset between the impurity diffusion region and the floating gate electrode, that is feared at the time when reducing size of the memory cell of the semiconductor memory indicated in the conventional example. Namely, it is possible to form the semiconductor memory that operates effectively without taking into consideration decrease of the margin between the impurity diffusion region and the floating gate electrode with reducing size of the memory cell.

Also, film thickness of the third insulating film is made to form in such a way as to become thicker than total film thickness of the gate insulator and the floating gate electrode deposited on the gate insulator. Thus capacitance between the floating gate electrode and the control gate electrode can be made to increase, by thickening film thickness of the third insulating film, thus it is possible to increase the capacitive coupling ratio. Further, it is possible to increase the capacitive coupling ratio in spite of size of the memory cell.

A manufacturing method of a semiconductor memory according to the present invention indicates a manufacturing method in which an impurity diffusion region with a second conductive type that is opposite to a first conductive type is made to form on a surface of a semiconductor substrate with the first conductive type, in which a floating gate electrode is made to form on the semiconductor substrate via a gate insulator, and in which a control gate electrode is made to form on the floating gate electrode via an interelectrode insulating film.

Here, in the manufacturing method of the semiconductor memory, the manufacturing method comprises the steps of forming a fourth insulating film on a surface of the semiconductor substrate via a buffer layer consisting of an oxide film whose film thickness is thicker than that of the gate insulator, forming unevenness portion while carrying out patterning to the buffer layer and the fourth insulating film, before carrying out laying of a third insulating film to the unevenness portion, removing the buffer layer and the fourth insulating film, after smoothing the third insulating film until surface of the fourth insulating film being exposed, forming a polycrystalline silicon film at underside of concave portion of the semiconductor substrate via the gate insulator and forming a polycrystalline silicon film on the third insulating film, and forming a floating gate electrode while removing the polycrystalline silicon film existing on an upper surface of the third insulating film.

For that reason, it is possible to form the floating gate electrode in such a manner as to form it in self-adjustable method at the surface of the side wall of the third insulating film (extended portion of the surface of the side wall of impurity diffusion region). Further, it is possible to manufacture the memory cell without consideration of margin between the floating gate electrode and the impurity diffusion region like the conventional example.

Further, total film thickness of the buffer layer and the fourth insulating film is formed thicker than total film thickness of the gate insulator and the polycrystalline silicon film existing on the gate insulator. Thereby, as described above, film thickness of the third insulating film can be made to form in such a way as to become thicker than total film thickness of the gate insulator and the floating gate electrode deposited on the gate insulator.

Here, when the third insulating film is formed with the High Density Plasma CVD method, the third insulating film is capable of being laid effectively on the unevenness portion of the silicon substrate. For instance, even though interval of the unevenness portion becomes narrow at the time realizing high-integrated memory cell or reducing size of the memory cell, it is possible to carry out laying of the third insulating film effectively by the use of the High Density Plasma CVD method with high characteristic for embedding to narrow gap.

Also, the semiconductor substrate is formed with single crystal silicon, the control gate electrode is formed with polycrystalline silicon, silicon oxide films are formed as the gate insulator and the third insulating film, silicone nitride film is formed as the fourth insulating film, and three layer structure insulating film consisting of a first silicon oxide film, a silicon nitride film and a second silicon oxide film is made to carry out as the interelectrode insulating film.

DETAILED DESCRPTION OF THE PREFERRED EMBODIMENT

A preferred embodiment of a semiconductor memory according to the present invention will be described below with reference to FIG. 1, FIG. 2 and FIG. 3.

Figure 1:
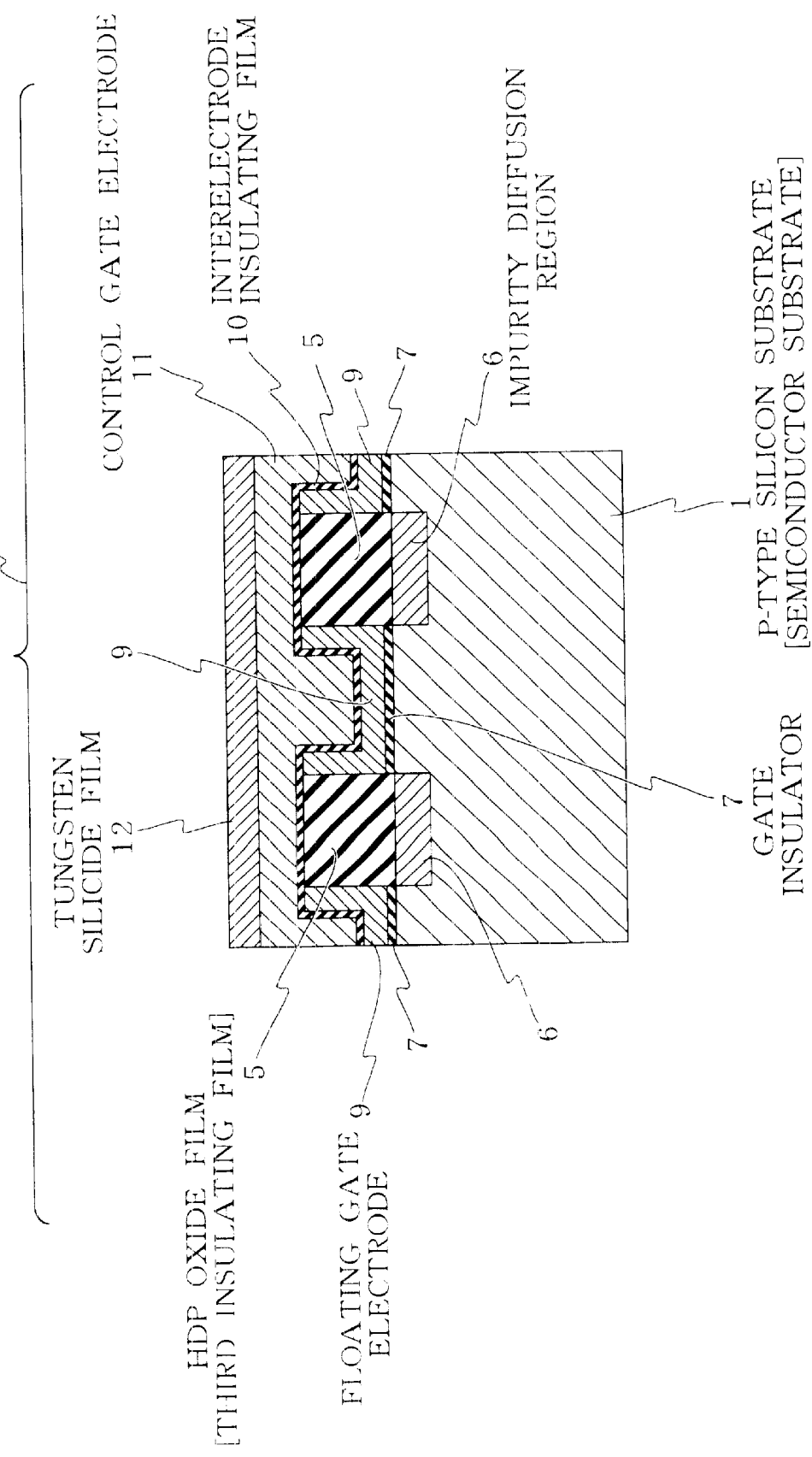
FIG. 1 is a sectional view illustrating one embodiment of a semiconductor memory of the present invention.

FIG. 1 illustrates a semiconductor memory 20 according to the present embodiment. The semiconductor memory 20 is Virtual Ground Cell type large-capacity NOR type OTP having impurity diffusion region 6 as a digit line.

Figure 5:
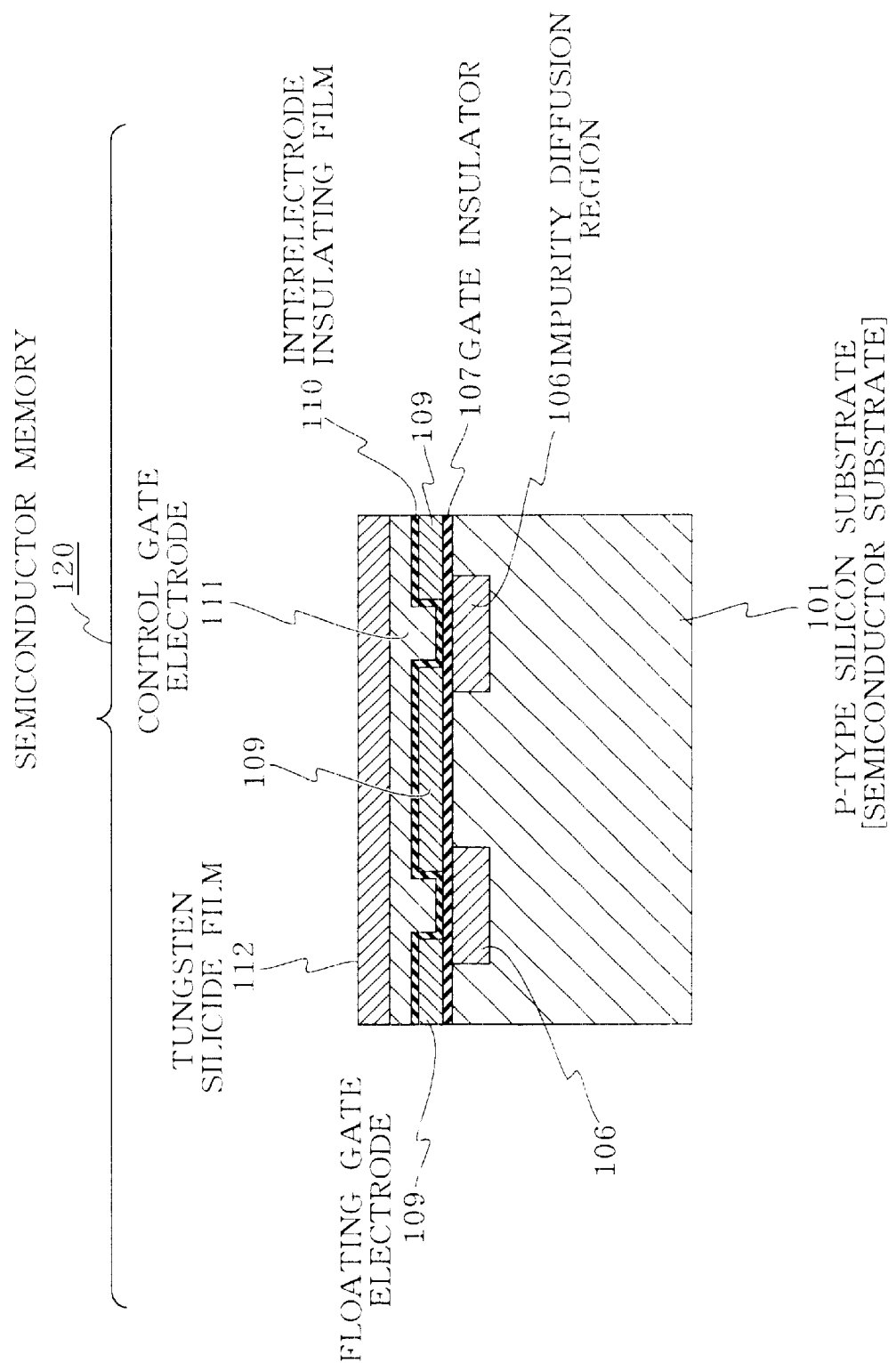
FIG. 5 is a sectional view of an arrow A—A in FIG. 4.
Figure 6A:
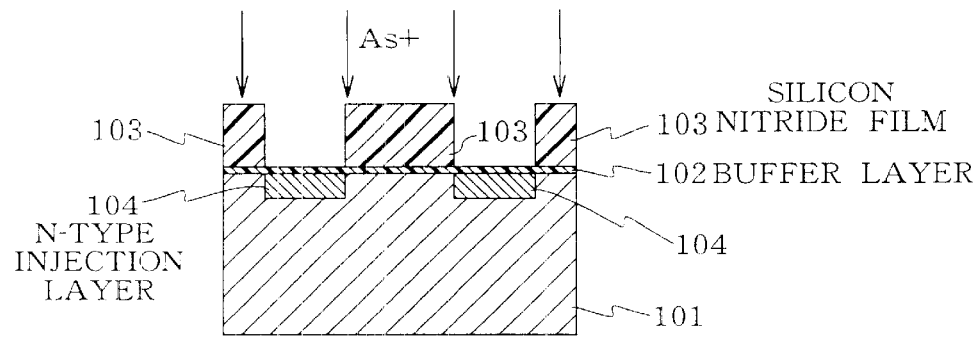
FIGS. 6(a)–6(d) are sectional views illustrating manufacturing process of the conventional semiconductor memory as seen from section of an arrow A—A illustrated in FIG. 4, and illustrating manufacturing process that progresses in order of FIG. 6(a) to FIG. 6(d).
Figure 6B:
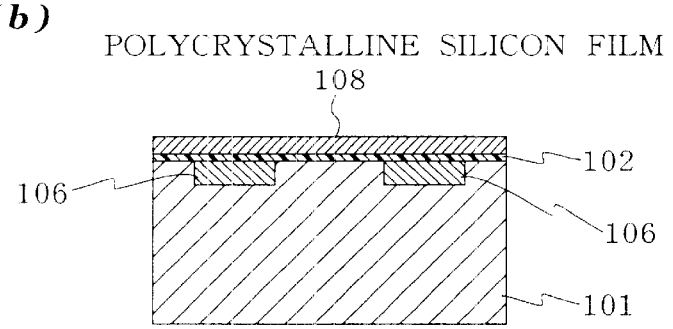
Figure 6C:
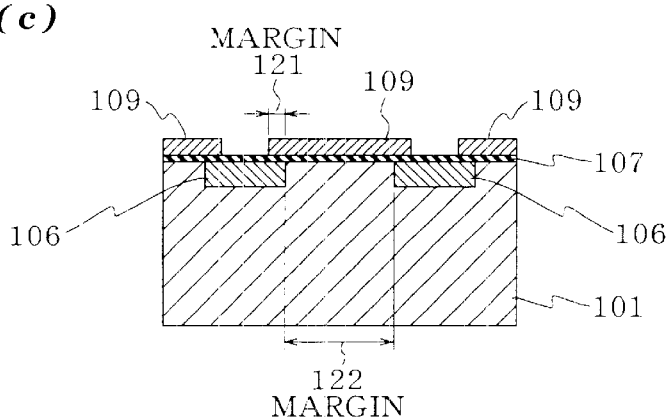
Figure 6D:
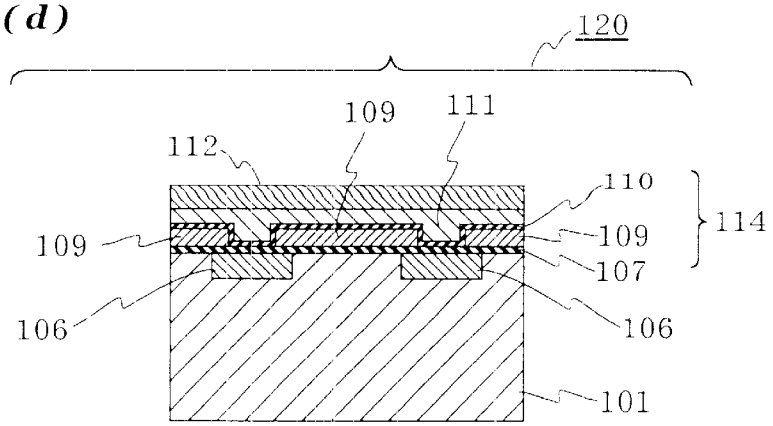

Here, the OTP 20 illustrated in FIG. 1 which is a sectional view is compared to that of the OTP 120 of the conventional example illustrated in FIG. 5. Manufacturing process of the OTP 20 illustrated in FIG. 1 is illustrated in FIGS. 2(a) to 2(c) and FIGS. 3(d) to 3(f). The manufacturing process progresses in order of FIGS. 2(a) to 2(c), FIGS. 3(d) to 3(f).

The OTP 20, as illustrated in FIG. 1, has a p-type silicon substrate (semiconductor substrate) 1 as single crystal silicon substrate, an impurity diffusion region 6 formed on the surface of this p-type silicon substrate 1, a gate insulator 7 made of silicon oxide film formed on the surface of the p-type silicon substrate 1 excepting the impurity diffusion region 6, and a third insulating film 5 formed on the surface of the impurity diffusion region 6. Furthermore, the OTP 20 has a floating gate electrode 9 made of polycrystalline silicon film formed on the surface of the gate insulator 7 and formed on surface of the side wall of the third insulating film 5, an interelectrode insulating film 10 formed on unevenness portion (unevenness portion consisting of the third insulating film 5 and the floating gate electrode 9) of this p-type silicon substrate 1, a control gate electrode 11 made of polycrystalline silicon film for embedding this unevenness portion, and a tungsten-silicide (WSi) film 12 which is deposited on this control gate electrode 11.

In this case, film thickness of the third insulating film 5, as illustrated in FIG. 1, is formed thicker than the total film thickness of the gate insulator 7 and the floating gate electrode 9.

Thus, capacitance "Cg" between the floating gate electrode 9 and the control gate electrode 11 can be made to ensure at the surface of the side wall of the third insulating film 5 in such a way as to form the third insulating film 5 thus thickened. Namely, in this case, specifically, it is possible to enlarge areas of surface of the side wall of both the floating gate electrode 9 and the control gate electrode 11 by thickening film thickness of the third insulating film 5. Thus, it is possible to increase the capacitance "Cg" between the floating gate electrode 9 and the control gate electrode 11. For that reason, it is possible to increase the capacitive coupling ratio "Cr" without changing size of the memory cell, thus, it becomes possible to cause voltage of data-writing to be lowered.

The third insulating film 5 in the present embodiment is silicon oxide film that is formed depending on High Density Plasma (HDP) CVD. Hereinafter, the third insulating film 5 is referred to as "HDP oxide film 5". Further, the interelectrode insulating film 10 is insulating film which is comprised of, for instance, ONO (Oxide-Nitride-Oxide) structure of the first silicon oxide film, the silicon nitride film, and the second silicon oxide film.

Continuously, manufacturing method of this OTP 20 will be explained.

Figure 2A:
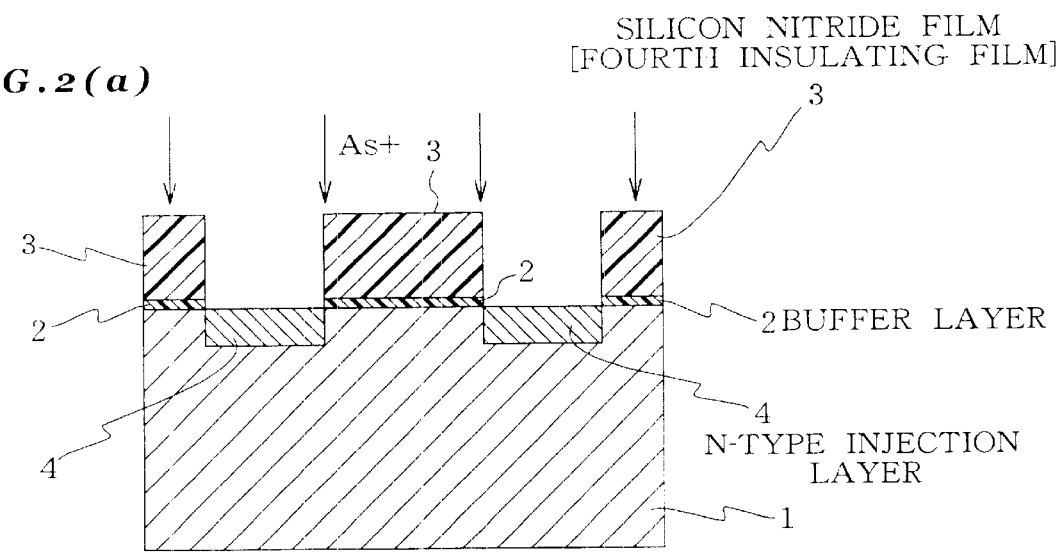
FIGS. 2(a)–2(c) are sectional views illustrating manufacturing process of the semiconductor memory according to the present embodiment illustrated in FIG. 1, and also illustrating manufacturing process that progresses in order of FIG. 2(a) to FIG. 2(c)

In the OTP 20, as illustrated in FIG. 2(a), firstly, buffer layer 2 made of oxide film is formed on the surface of the p-type silicon substrate 1 in the film thickness of, for instance, 10 to 30 nm by carrying out thermal oxidation to the p-type silicon substrate 1. Silicon nitride film (the fourth insulating film) 3 is deposited on the buffer layer 2 in the film thickness of, for instance, 100–300 nm. Then, the buffer layer 2 and the silicon nitride film 3 of a portion (for instance, portion of width of 100–200 nm) that becomes impurity diffusion region 6 in the future are removed by, for instance, photolithography and dry etching. After that, injection of arsenic ion (As$^+$) as n-type impurity is made to carry out with the doze of $1 \times 10^{13}$ to $5 \times 10^{15}$ (ions/cm$^3$) with the silicon nitride film 3 as mask materials, thus, n-type injection layer 4 is formed. Furthermore, the impurity diffusion region 6 is formed in such a way as to carry out thermal treatment while diffusing impurity of the n-type injection layer 4.

Figure 2B:
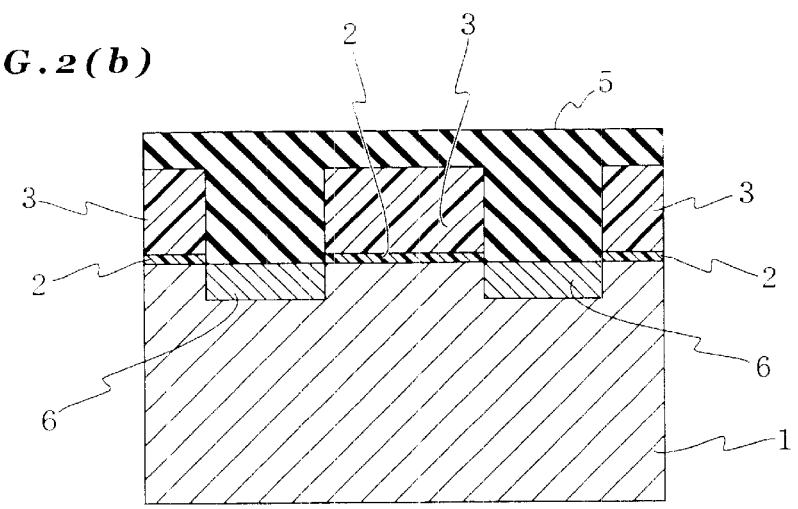
Figure 2C:
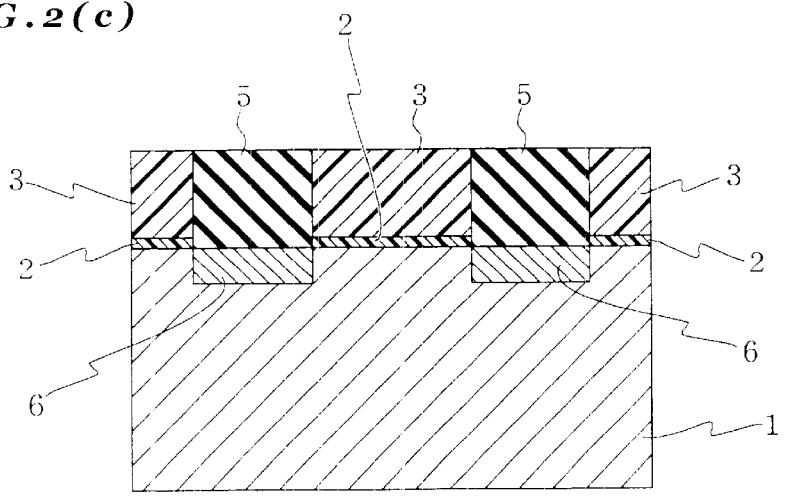

Continuously, as illustrated in FIG. 2(b), the unevenness portion on the p-type silicon substrate 1 is embedded with the HDP oxide film 5 formed by the use of the High Density Plasma CVD method. In this case, the HDP oxide film 5 is deposited such that its film thickness amounts to, for instance, 500 to 2000 nm. Then, the HDP oxide film 5, as illustrated in FIG. 2(c), is polished by the use of, for instance, CMP (Chemical Mechanical Polishing) method until surface of the silicon nitride film 3 is exposed. Thus, the HDP oxide film 5 is made to leave at only upside of the impurity diffusion region 6.

Thus, the HDP oxide film 5 made of silicon oxide film can be laid (formed) effectively on the unevenness portion of the p-type silicon substrate 1 by the use of the High Density Plasma CVD method with high characteristic for embedding to narrow gap.

Figure 3D:
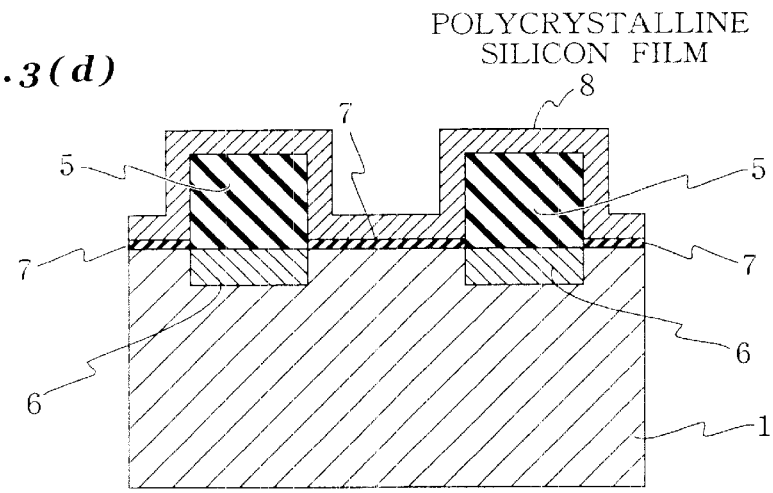
FIGS. 3(d)–3(f) are sectional views illustrating manufacturing process of the semiconductor memory according to the present embodiment illustrated in FIG. 1, and illustrating manufacturing process following on the process of FIG. 2(c) that progresses in order of FIG. 3(d) to FIG. 3(f)

Next, as illustrated in FIG. 3(d), the buffer layer 2 and the silicon nitride film 3 are removed, for that reason, surface of the p-type silicon substrate 1 which turns into active region of 200 to 300 nm is exposed. Then, the gate insulator 7 is formed on the surface of the p-type silicon substrate 1 in the film thickness of, for instance, 5 to 15 nm. In this case, as for the gate insulator 7, silicon oxide film is formed in such a way as to carry out thermal oxidation to, for instance, the p-type silicon substrate 1. Furthermore, polycrystalline silicon film 8 with film thickness of 50 to 300 nm is formed at the unevenness portion (HDP oxide film 5 and the gate insulator 7) of the p-type silicon substrate 1 by the use of, for instance, the CVD method.

Figure 3E:
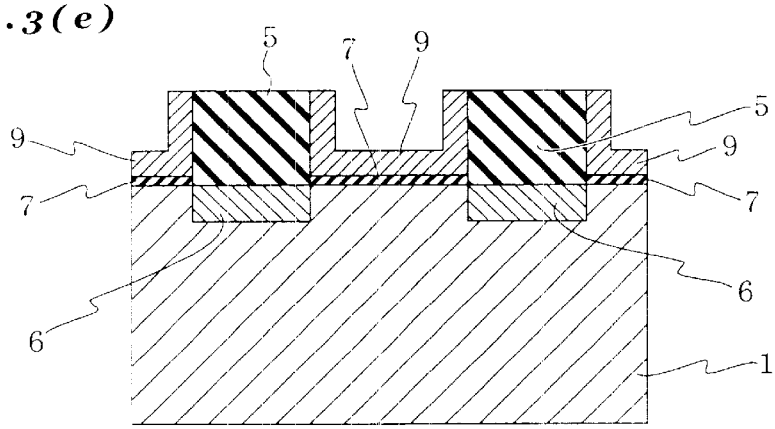

Further, as illustrated in FIG. 3(e), the polycrystalline silicon film 8 is polished by the use of, for instance, the CMP method until the surface of the HDP oxide film 5 is exposed. Thus, the floating gate electrode 9 made of the polycrystalline silicon film 8 is formed in such a way as to leave the polycrystalline silicon film 8 only at the interval between the HDP oxide films 5.

Thus, the floating gate electrode 9 can be made to form at the surface of the side wall (extended portion of the surface of the side wall of the impurity diffusion region 6) of the HDP oxide film 5 with self-adjustable method, therefore, it is possible to form the OTP 20 without considering offset between the impurity diffusion region 6 and the floating gate electrode 9 that is feared at the time when reducing size of the memory cell of the OTP 120 indicated in the conventional example. Namely, since it is possible to solve malfunction of operation of the memory cell when reducing size of the memory cell, it becomes possible to reduce effectively the size of memory cell of the OTP 20 according to the present embodiment.

Figure 3F:
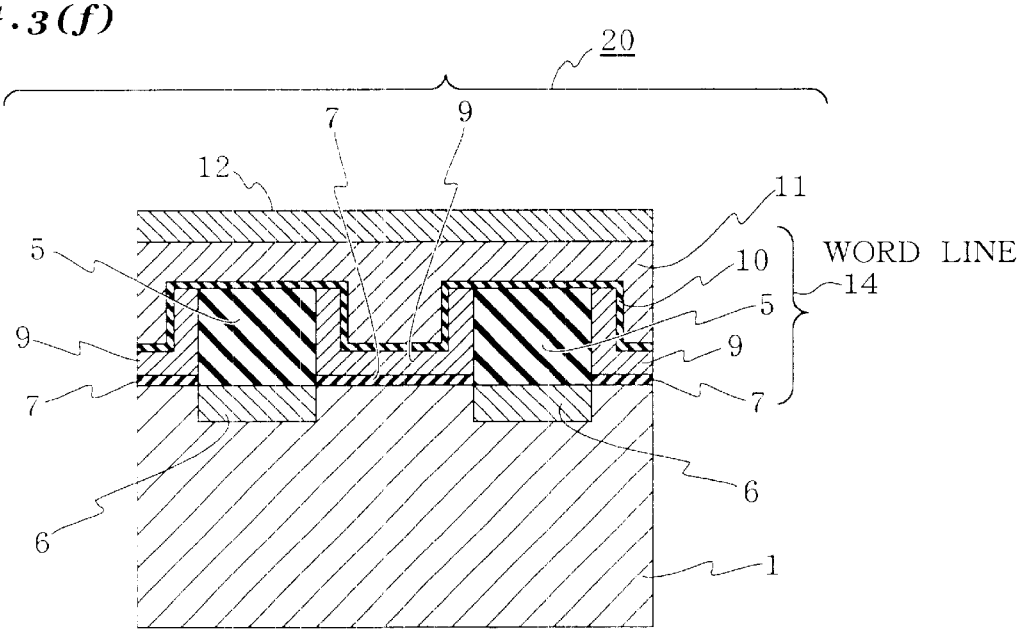
Figure 4:
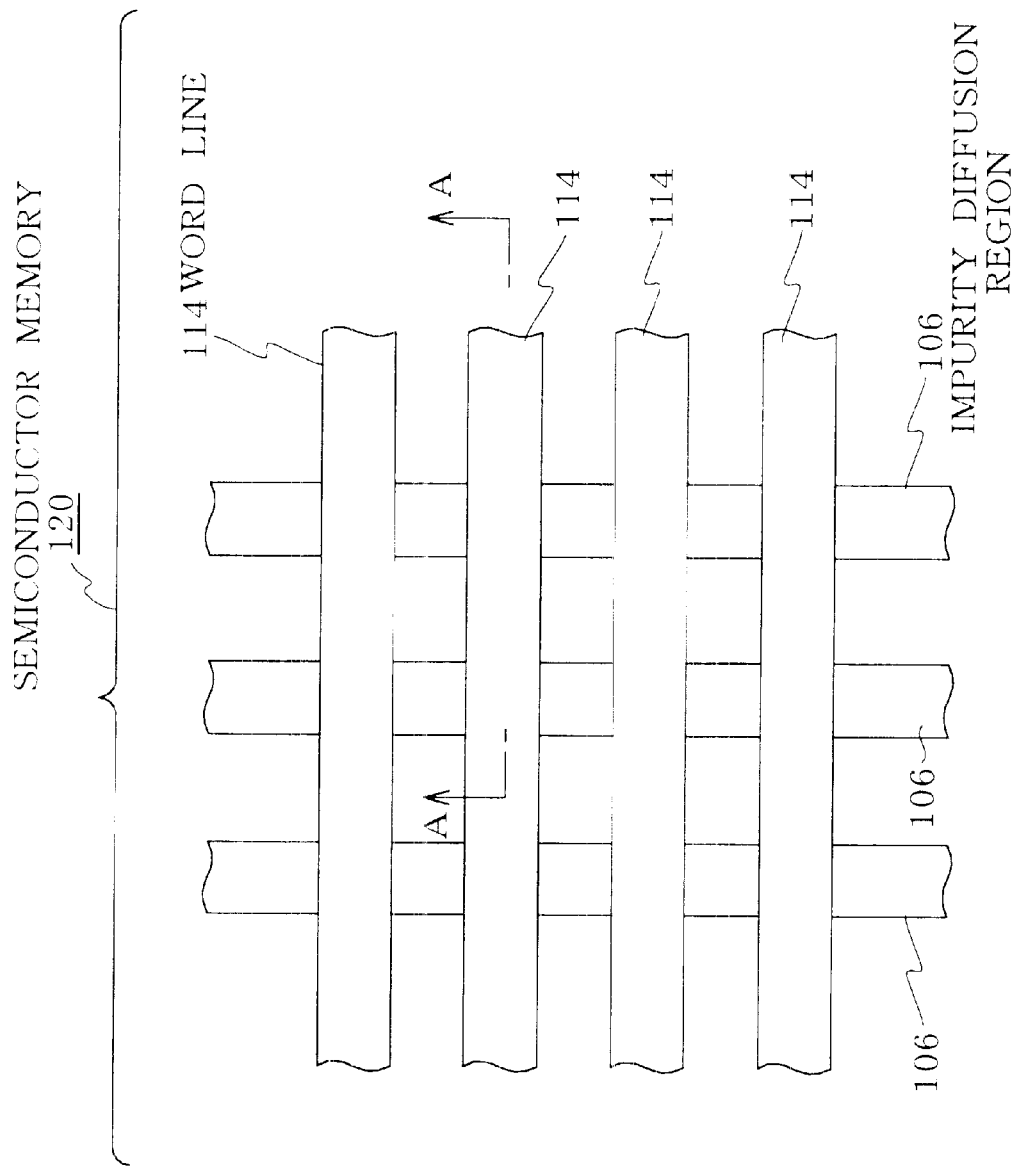
FIG. 4 is a typical plan view illustrating memory cell portion of the conventional semiconductor memory.

Subsequently, as illustrated in FIG. 3(f), interelectrode insulating film 10 with film thickness of 15 to 30 nm consisting of ONO structure of, for instance, HTO film (silicon oxide film)/silicon nitride film/HTO film is formed at the unevenness portion (unevenness portion consisting of the HDP oxide film 5 and the floating gate electrode 9) of the p-type silicon substrate 1. After that, the unevenness portion is embedded by the use of, for instance, polycrystalline silicon film with film thickness of 100 to 200 nm, for that reason, the control gate electrode 11 made of polycrystalline silicon film is formed. Then, the tungsten silicide film 12 with film thickness of, for instance, 100 to 200 nm that is deposited thereon by the use of the CVD method is formed.

Further, patterning is carried out while leaving a portion which should become the word line 14, for instance, width of 150 to 200 nm (in this case, interval of the word line 14 is 150 to 200 nm) of the floating gate electrode 9, the interelectrode insulating film 10, the control gate electrode 11, and the tungsten silicide film 12, thus the OTP 20 according to the present embodiment is formed.

The semiconductor memory according to the present invention is capable of forming the floating gate electrode in such a manner as to form it in self-adjustable method at the surface of the side wall of the third insulating film (extended portion of the surface of the side wall of impurity diffusion region) due to its manufacturing method, therefore it is possible to operate the memory cell effectively without taking into consideration margin between the floating gate electrode and the impurity diffusion region at the step of design like the conventional example.

Further, the floating gate electrode can be made to position on the surface of the side wall of the third insulating film (extended portion of the surface of the side wall of the impurity diffusion region), thus capacitance between the floating gate electrode and the control gate electrode can be made to set appropriately depending on film thickness of the third insulating film, therefore specifically, the capacitance between the floating gate electrode and the control gate electrode can be made to increase by thickening film thickness of the third insulating film, thus it is possible to increase the capacitive coupling ratio in spite of size of the memory cell. For that reason, it becomes possible to lower voltage that is applied to the memory cell for writing data.

As described-above, it is possible to realize high-integrated memory cell effectively without altering size of the memory cell. Furthermore, it is possible to realize high-integrated memory cell effectively while reducing size of the memory cell.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-167349 (Filed on Jun. 5, 2000) including specification, claims, drawings and summary are incorporated herein by reference in its entirety.

What is claimed is:

1. A semiconductor memory, in which there is provided an impurity diffusion region with a second conductive type that is opposite to a first conductive type on a surface of a semiconductor substrate with said first conductive type, in which there is provided a floating gate electrode formed on said semiconductor substrate via a gate insulator, and in which there is provided a control gate electrode formed on said floating gate electrode via an interelectrode insulating film, comprising:

said gate insulator provided n the surface of the semiconductor substrate other than said impurity diffusion region;

a third insulating film with fi m thickness thicker than said gate insulator on the surface of said impurity diffusion region; an said floating gate electrode extended to a surface of a side wall of said third insulating film, wherein an interface between said gate insulator and said semiconductor substrate is substantially coplanar with an interface between said third insulating film and said impurity diffusion region.

2. A semiconductor memory according to claim 1, wherein said semiconductor substrate is made of single crystal silicon, said floating gate electrode and said control gate electrode are made of polycrystalline silicon film, said gate insulator and said third insulating film are made of a silicon oxide film, and interelectrode insulating film has a three-layer structure consisting of a first silicon oxide film, a silicon nitride film, and a second silicon oxide film.

3. A semiconductor memory, in which there is provided an impurity diffusion region with a second conductive type that is opposite to a first conductive type on a surface of a semiconductor substrate with said first conductive type, in which there is provided a floating gate electrode formed on said semiconductor substrate via a gate insulator, and in which there is provided a control gate electrode formed on said floating gate electrode via an interelectrode insulating film, comprising:

said gate insulator provided on the surface of the semiconductor substrate other than said impurity diffusion region;

a third insulating film with film thickness thicker than said gate insulator on the surface of said impurity diffusion region; and said floating gate electrode extended to a surface of a side wall of said third insulating film, wherein film thickness of said third insulating film is made to form in such a way as to become thicker than total film thickness of the gate insulator and the floating gate electrode deposited on said gate insulator.

4. A semiconductor memory according to claim 3, wherein said semiconductor substrate is made of single crystal silicon, said floating gate electrode and said control gate electrode are made of polycrystalline silicon film, said gate insulator and said third insulating film are made of a silicon oxide film, and interelectrode insulating film has a three-layer structure consisting of a first silicon oxide film, a silicon nitride film, and a second silicon oxide film.

* * * * *